United States Patent [19]

Nakajima et al.

[11] Patent Number: 5,034,921
[45] Date of Patent: Jul. 23, 1991

[54] HIGH SPEED OPTICAL MEMORY CIRCUIT

[75] Inventors: Kazutoshi Nakajima; Hirofumi Kan; Kenichi Sugimoto; Yoshihiko Mizushima; Toru Hirohata; Takashi Iida; Yoshihisa Warashina, all of Shizuoka, Japan; Toru Hirohata; Takashi Iida

[73] Assignee: Hamamatsu Photonics Kabushiki Kaisha, Shizuoka, Japan

[21] Appl. No.: 375,983

[22] Filed: Jul. 6, 1989

[30] Foreign Application Priority Data

Jul. 29, 1988 [JP] Japan ................ 63-191385

[51] Int. Cl.$^5$ ............................. G11C 7/00
[52] U.S. Cl. ............................. 365/112; 365/215
[58] Field of Search ............... 365/64, 107, 110, 112, 365/149, 215; 250/213 A; 357/19

[56] References Cited

U.S. PATENT DOCUMENTS 3,196,405  7/1965  Gunn ................... 365/149

FOREIGN PATENT DOCUMENTS 2185165  7/1987  United Kingdom ........... 365/109

OTHER PUBLICATIONS

Lentine, A. L., et al., "Symmetric self-electro-optic effect device: Optical set-reset latch," 320 Applied Physic Letters, No. 17, Apr. 25, 1988.
Sugeta, T. et al., "Metal-Semiconductor-Metal Photodetector for High-Speed Optoelectronic Circuits", Japanese Journal of Applied Physics, vol. 19, Supplement 19-1, pp. 459-464, (1980).

Primary Examiner—James W. Moffitt
Assistant Examiner—Jack A. Lane
Attorney, Agent, or Firm—Finnegan, Henderson, Farabow, Garrett, and Dunner

[57] ABSTRACT

An optical memory circuit comprises two photodetectors, and an intermediate signal conductor for connecting the two photodetectors, wherein the two photodetectors and the signal conductor are connected in series in a closed circuit, wherein each of the photodetectors comprises two spaced Schottky electrodes symmetrically disposed on a semiconductor substrate and the signal conductor has a capacitance with a time constant of a potential of the signal conductor such that charges are stored in the signal conductor when an optical write signal is incident on one photodetector and stored charges are released from the signal conductor when an optical read signal is incident on the other photodetector.

5 Claims, 1 Drawing Sheet

HIGH SPEED OPTICAL MEMORY CIRCUIT

BACKGROUND OF THE INVENTION

The present invention relates to a memory circuit which performs a reading and a writing operation with an optical signal.

Conventional semiconductor memory circuits employ transistors in each of the writing, memory and reading sections. If it is necessary to design an optical memory circuit that performs a reading and a writing operation with an optical signal, common practice is to couple a photodetector to each of the read signal and write signal input terminals in a conventional memory circuit composed of transistors. A problem with this approach is that since the memory circuit section is of a conventional type which uses transistors, the writing and reading speed are limited by the operating time of the transistor, thus making it impossible to fully exploit the advantage of using input optical signals which permit high-speed operation.

SUMMARY OF THE INVENTION

An object, therefore, of the present invention is to solve the aforementioned problem of the prior art.

This object of the present invention can be attained by an optical memory circuit which comprises two photodetectors and an intermediate signal conductor for connecting the two photodetectors, wherein the two photodetectors and the intermediate signal conductor are connected in series in a closed circuit, wherein each of the photodetectors comprises two spaced Schottky electrodes symmetrically disposed on a semiconductor substrate and the signal conductor has a capacitance with a time constant of potential of the signal conductor such that charges are stored in the signal conductor when light is incident on one photodetector and the stored charges are released from the signal conductor when light is incident on the other photodetector.

When light is incident on one of the two photodetectors, carriers are activated by photoelectric conversion and charges are stored in the intermediate signal conductor. These charges are held in the intermediate signal conductor until light is incident on the other photodetector, whereupon it becomes conducting and the stored charges are released.

Other and further objects, features and advantages of the invention will appear more fully from the following description taken in connection with the accompanying drawings.

DETAILED DESCRIPTION OF THE INVENTION

Figure 1:
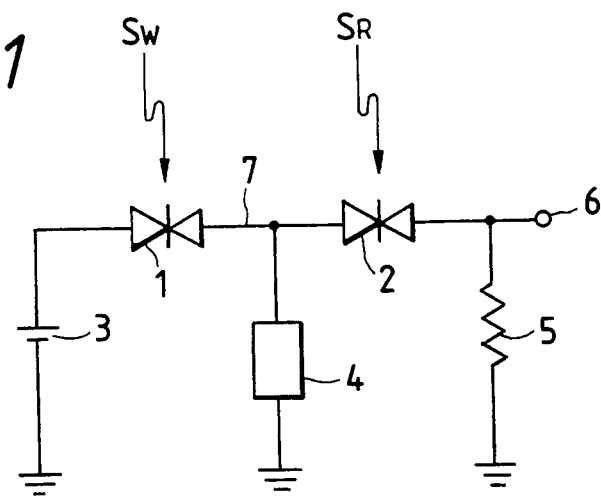
FIG. 1 is a circuit diagram showing an embodiment of the present invention.

FIG. 1 is a circuit diagram showing an embodiment of the present invention. Shown by 1 and 2 are photodetectors for write and read modes, respectively. Each of the photodetectors 1 and 2 comprises two spaced Schottky electrodes that are disposed to face each other on a semiconductor substrate in a symmetric way. These photodetectors operate so that they become conducting only when a predetermined amount of light is incident thereon. For details of the construction of these photodetectors 1 and 2, see "Metal-Semiconductor-Metal Photodetector for High-Speed Optoelectronic Circuits" by T. Sugeta, T. Urisu, S. Sakata and Y. Mizushima in Jpn. J. of Appl. Phys., 19(1980) Supplement 19-1, pp. 459–464. The symbol marks used for the photodetectors 1 and 2 in FIG. 1 were originally conceived by the present inventors. One end of the photodetector 1 is connected to the positive electrode of a bias voltage source 3 having its negative electrode grounded. The other end of the photodetector 1 is connected to one end of the photodetector 2 via a signal conductor 7. A resetting switch 4, having one end grounded, is connected at the other end to the middle point of the signal conductor 7. The other end of the photodetector 2 is connected both to a load resistance 5, having one end grounded, and to an output terminal 6.

The circuit shown in FIG. 1 will operate as follows.

As long as an optical write signal $S_w$ is incident on the photodetector 1, the latter remains conducting and a potential of the signal conductor 7 is raised to the level equal to the potential of the bias voltage source 3. Thereafter, in response to a decrease in the write signal $S_w$, the photodetector 1 becomes non conducting and the voltage at that time is held in the signal conductor 7. If, under this condition, an optical read signal $S_R$ is incident on the photodetector 2, the latter becomes conducting and a current flows through the load resistance 5, thereby producing a signal at the output terminal 6. No output signal will be produced unless a potential has built up in the signal conductor 7 when read signal $S_R$ is incident on the photodetector 2. Thus, in the circuit being described, the signal conductor 7 is normally held at high impedance or floating potential to realize a 1-bit memory circuit.

The resetting switch 4 is an optional element and may be employed, for instance, to initialize the state of memory. If necessary, a switching element incorporating a bias source may be used as the resetting switch 4 and specific examples of such element are a transistor that operates on a gate electric signal and a photodetector that operates on an optical signal. These switching elements may be replaced by a CR element having a large time constant. In this latter case, memory is held within an operating range effectively defined by the time constant. As described above, a potential storing function is realized by making the time constant of the signal conductor 7 substantially long, and in order to reset it at a substantially long time constant, a transistor, etc. may be used.

Figure 2:
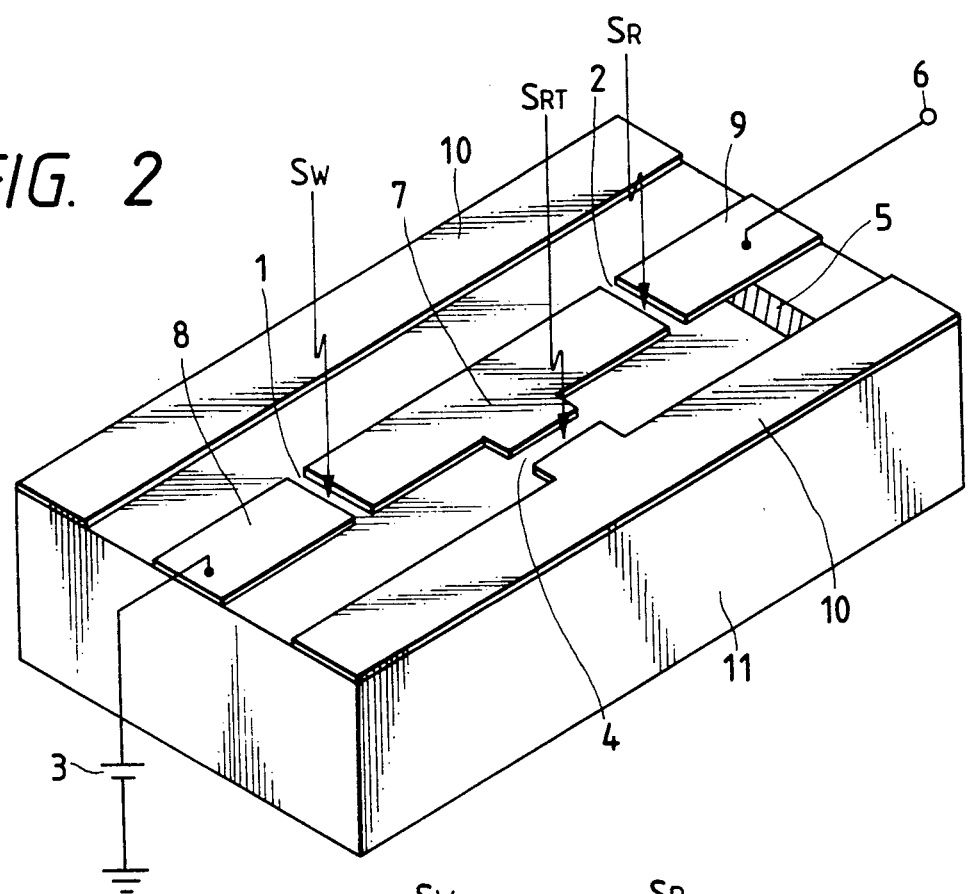
FIG. 2 is a perspective view showing an integrated circuit device that incorporates the above embodiment of the present invention.

FIG. 2 is a perspective view showing an optical memory circuit device in which the circuit shown in FIG. 1 is actually integrated monolithically. In FIG. 2, the elements which are the same as those shown in FIG. 1 are identified by like numerals or symbols. A semiconductor substrate shown by reference numeral 11 is made of a semiconductor material such as Si or GaAs. There are provided on the surface of the semiconductor substrate 11 a photodetector 1 for write mode, a photodetector 2 for read mode, a resetting switch 4, a load resistance 5, signal conductors 7-9, and a grounding conductor 10. The grounding conductor 10 taken together with the signal conductors 7-9 form a strip line. An insulating thin film is provided between the semiconductor substrate 11 and each of the signal conductors 7–9 and the grounding conductor 10 except in the areas where the photodetectors 1 and 2, resetting switch 4 and load resistance 5 are formed. The photodetector 1 is formed of two Schottky junctions between the edges of the signal conductors 7 and 8 and the semiconductor substrate 11. The photodetector 2 is formed of two Schottky junctions between the edges of the signal conductors 7 and 9 and the semiconductor substrate 11. In both cases, the surface of the semiconductor substrate between the two Schottky junctions serves as a light-receiving surface. The resetting switch 4 is also constructed as a photodetector having a similar design to the photodetectors 1 and 2, that is, two Schottky junctions are formed between the edges of the signal conductor 7 and grounding conductor 10 and the semiconductor substrate 11. The load resistance 5 is a n+ high-density-doped region formed by doping impurities in the surface region of the semiconductor substrate 11, and opposite ends of this resistance 5 are connected to the signal conductor 9 and the grounding conductor 10. The signal conductor 8 is connected to an external bias voltage source 3 whereas the signal conductor 9 is connected to the output terminal 6.

The circuit system shown in FIG. 2 will operate as follows. When an optical write signal $S_W$ is supplied to the photodetector 1, a potential of the signal conductor 7 is raised to a level equal to the potential of the bias voltage source 3. In response to a decrease in the incident write signal $S_W$ the potential at that time is held in the signal conductor 7. Thereafter, when an optical read signal $S_R$ is supplied to the photodetector 2, a current flows through the load resistance 5 and a signal is produced at the output terminal 6. When an optical reset signal $S_{RT}$ is incident on the photodetector 4 which is a resetting switch, the potential of the signal conductor 7 is erased to reset the overall circuit.

Figure 3:
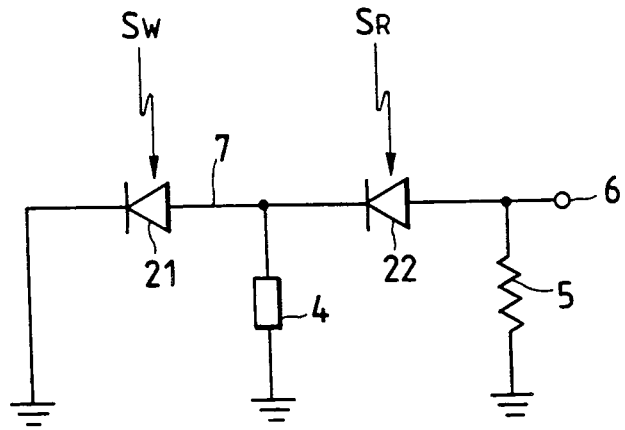
FIG. 3 is a circuit diagram showing another embodiment of the present invention.

FIG. 3 is a circuit diagram showing another embodiment of the present invention. This embodiment differs from the first embodiment in that the photodetectors 1 and 2 arranged in a symmetric electrode layout are replaced by pn-junction photodiodes 21 and 22 which serve as photodetectors for a write and a read mode, respectively. Another difference is that the bias voltage source 3 is not included in the second embodiment. The cathode of the photodetector 21 is grounded, and its anode is connected to the cathode of the photodetector 22 via a signal conductor 7. The anode of the photodetector 22 is connected to both a load resistance 5 and an output terminal 6. The signal conductor 7 is also connected to a resetting switch 4. If necessary, a bias voltage source may be added to the circuit of this second embodiment.

When an optical write signal $S_W$ is incident on the photodetector 21, carriers are generated and the current due partly to holes generated in the n-type region and partly to electrons generated in the p-type region will flow to change the potential of the signal conductor 7. The resultant potential will be held in the signal conductor 7 after termination of the optical write signal $S_W$. Thereafter, when an optical read signal $S_R$ is incident on the other photodetector 22, the latter becomes conducting and a current flows through the load resistance 5 to produce a signal at the output terminal 6.

In the two embodiments described above, each of the photodetectors are formed either of two spaced Schottky junctions that face each other on a semiconductor substrate or of a pn-junction photodiode. Other designs may of course be employed to construct photodetectors, such as by forming a Schottky electrode and an ohmic electrode that are spaced to face each other on a semiconductor substrate, or by arranging two ohmic electrodes in a symmetric way.

In the embodiment shown in FIG. 2, the load resistance 5 is formed by doping impurities into the semiconductor substrate. It should, however, be noted that this is not the only method of forming the load resistance 5 and that a film resistor may be employed. In the embodiment shown in FIGS. 1 and 2, the photodetector 1 is connected to the positive electrode of the bias voltage source 3 but the device operation is in no way dependent upon the polarity of the bias voltage.

As will be understood from the foregoing description, the optical memory circuit of the present invention has the advantage that it is capable of performing a memory operation on optical input signals with a simple configuration in which two photodetectors are connected in series by an intermediate signal conductor which has a time constant of potential set to an appropriately large value. In addition, the optical memory circuit of the present invention which does not use any slow active devices such as a transistor is capable of very fast memory operation. This would be a great benefit to optical wiring which is becoming popular as a means for increasing the operating speed of computers, because, with this invention, data storage processing can be accomplished with the high-speed characteristic of light being utilized to the fullest extent.

What is claimed is:

1. An optical memory circuit, comprising:
   a semiconductor substrate;
   two photodetectors, each operable at a bias of either polarity, and each comprising two Schottky electrodes formed symmetrically on said semiconductor substrate;
   an intermediate signal conductor, with a predetermined potential, for connecting said two photodetectors; and
   bias voltage means, connected to one of the photodetectors, for providing a bias voltage of either polarity to said intermediate signal conductor through one of said photodetectors;
   wherein said two photodetectors and said intermediate signal conductor are connected in series in a closed circuit, and said intermediate signal conductor has a capacitance with a predetermined time constant such that charges are stored in said intermediate signal conductor when a light signal is incident on one of said photodetectors and said stored charges are released from said intermediate signal conductor when said light signal is incident on the other one of said photodetectors.

2. The optical memory circuit as claimed in claim 1, further comprising a resetting switch, connected to said intermediate signal conductor, for resetting said predetermined potential of said intermediate signal conductor.

3. The optical memory circuit as claimed in claim 1, wherein said two photodetectors and said intermediate signal conductor are formed monolithically on said semiconductor substrate.

4. The optical memory circuit as claimed in claim 3, further comprising:
   a load resistance connected to one of said photodetectors; and a resetting switch, connected to said intermediate signal conductor, for resetting said predetermined potential of said intermediate conductor;

wherein said load resistance and said resetting switch are formed monolithically on said semiconductor substrate.

5. The optical memory circuit as claimed in claim 4, wherein said optical memory circuit is in the form of a strip line.

* * * * *